United States Patent
Sun et al.

(10) Patent No.: US 7,101,802 B2
(45) Date of Patent: Sep. 5, 2006

(54) METHOD FOR FORMING BOTTLE-SHAPED TRENCH

(75) Inventors: Chien-Jung Sun, Taipei (TW); Teng-Wang Huang, Hualien (TW); Chang-Rong Wu, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 217 days.

(21) Appl. No.: 10/720,311

(22) Filed: Nov. 24, 2003

(65) Prior Publication Data

US 2005/0009360 A1  Jan. 13, 2005

(30) Foreign Application Priority Data

Jul. 11, 2003 (TW) .............................. 92118968 A

(51) Int. Cl.
*H01L 21/311* (2006.01)
(52) U.S. Cl. ....................................... 438/700; 438/243
(58) Field of Classification Search ................ 438/243, 438/244, 245, 700, 702, 703, 704, 706, 712, 438/719

See application file for complete search history.

(56) References Cited

U.S. PATENT DOCUMENTS

| 4,298,629 | A | * | 11/1981 | Nozaki et al. ............... 438/776 |
| 6,143,645 | A | * | 11/2000 | Hsu et al. .................... 438/627 |
| 6,451,662 | B1 | * | 9/2002 | Chudzik et al. ............. 438/386 |
| 6,472,321 | B1 | * | 10/2002 | Srinivasan et al. ......... 438/680 |
| 6,534,376 | B1 | * | 3/2003 | Tews ............................ 438/386 |
| 6,828,185 | B1 | * | 12/2004 | Lim et al. .................... 438/216 |
| 6,838,334 | B1 | * | 1/2005 | Gluschenkov et al. ...... 438/243 |
| 6,924,204 | B1 | * | 8/2005 | Tsai et al. .................... 438/386 |
| 2003/0082884 | A1 | * | 5/2003 | Faltermeier et al. ......... 438/387 |

* cited by examiner

*Primary Examiner*—Kin-Chan Chen
(74) *Attorney, Agent, or Firm*—Quintero Law Office

(57) ABSTRACT

The invention provides a method for forming a bottle-shaped trench. A semiconductor substrate having a trench and a pad stack layer formed thereon is provided. A masking layer is then formed in the lower portion of the trench. Plasma nitridation is then performed to form a nitride layer covering the sidewalls of the trench, followed by removing the masking layer to expose the sidewalls of the trench. The lower portion of the trench is then expanded by etching to form a bottle-shaped trench.

29 Claims, 13 Drawing Sheets

METHOD FOR FORMING BOTTLE-SHAPED TRENCH

BACKGROUND OF THE INVENTION

1. Field of the Invention

The invention relates to a bottle-shaped trench fabrication method, and more particularly to a fabrication method for forming a bottle-shaped trench by plasma nitridation.

2. Description of the Related Art

Generally speaking, capacitors widely used in dynamic random access memory (DRAM) are formed by two conductive layers (electrode plates) having an insulation layer therebetween. The ability to store the electric charge of a capacitor depends on the thickness and electrical characteristics of the insulation layer, and the surface area of the electrode plate. Recent developments to reduce the size of semiconductor elements to enhance integration density require the memory cell area to be continuously reduced to hold a large number of memory cells, and thereby increase density. The electrode plates of a capacitor in a memory cell however must provide sufficient surface area to store sufficient electric charge.

Nevertheless, when element size is continuously reduced, the trench storage node capacitance of DRAM is also reduced. As a result, storage capacitance must be increased to maintain excellent memory operating performance.

Currently, the method for increasing DRAM storage capacitance increases the width of the bottom of a trench, thereby increasing surface area by forming bottle-shaped trench capacitors.

FIGS. 1A to 1K are cross-sections showing the conventional method for forming a bottle-shaped trench. In FIG. 1A, a substrate 100 with a trench therein is provided, a pad layer is formed on the substrate 100, and the pad layer comprises an oxide layer 102 and a nitride layer 104. A sidewall oxide layer 106 is formed on the trench sidewall by thermal oxidation. A protective nitride layer 108 and a polysilicon layer 110 are formed thereon by chemical vapor deposition (CVD). In FIG. 1B, the polysilicon layer 110 is oxidized forming a protective oxide layer 120. In FIG. 1C, a mask layer 122 is formed to cover the lower portion of the trench, the mask layer 122 comprises, for example, a photoresist material. In FIG. 1C, the protective oxide layer 120 not protected by the mask layer 122, is removed to form a protective oxide layer 120'. Then the mask layer 122 is removed as in FIG. 1E. In FIG. 1F, a sidewall nitride layer 124 is formed on the upper portion of the trench by nitridation. The protective oxide layer 120' is then removed as shown in FIG. 1G. In FIG. 1H, the protective nitride layer 108 is then removed to form a protective oxide layer 108'. The sidewall nitride layer 124 is removed as shown in FIG. 1I. In FIG. 1J, the lower portion of sidewall oxide layer 106 is removed to form a sidewall oxide layer 106'. In FIG. 1K, the lower portion of the trench is etched to form a bottle-shaped trench by wet etching.

The above-mentioned bottle-shaped trench fabrication method is complicated, and due to the continuous reduction in semiconductor scaling, this fabrication method is progressively more complicated. Therefore, a simple fabrication method for forming the bottle-shaped trench is necessary.

SUMMARY OF THE INVENTION

Accordingly, an object of the invention is to provide a simple method for forming a bottle-shaped trench.

To achieve the above object, the invention provides a method for forming a bottle-shaped trench comprising the following steps, providing a substrate with a trench and a pad layer thereon, filling a mask layer in the lower portion of the trench, using plasma nitridation to form a sidewall nitride layer on the trench sidewall, removing the mask layer, etching the sidewall and bottom of the trench not isn't protected by the sidewall nitride layer, to obtain the bottle-shaped trench.

To achieve the above object and improve the nitride layer resistance, the invention further provides a method for forming a bottle-shaped trench comprising an added step before plasma nitridation of etching a small portion of pad oxide near the trench to reveal a corner of the substrate. Due to this treatment, the nitride layer has better adhesion during the sequent etching process.

DESCRIPTION OF THE DRAWINGS

For a better understanding of the present invention, reference is made to a detailed description to be read in conjunction with the accompanying drawings, in which.

REFERENCE NUMERALS IN THE DRAWINGS

Figure 1A:
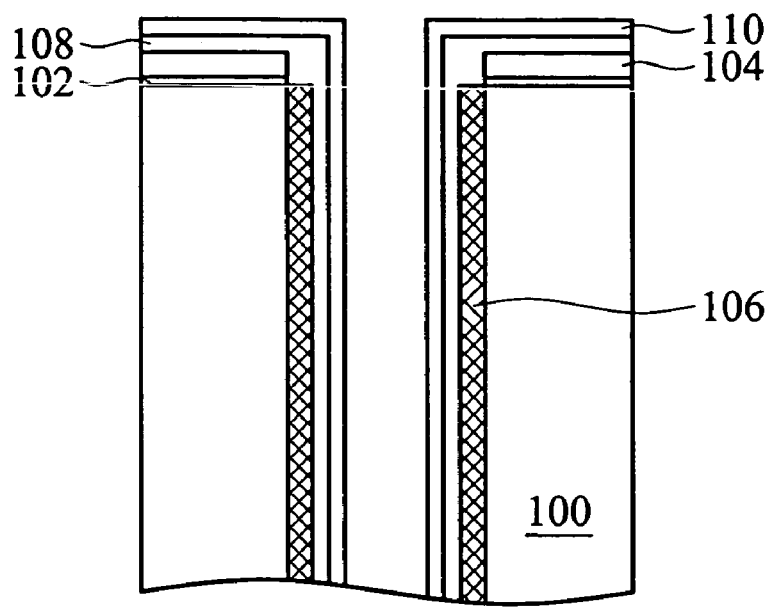
FIGS. 1A to 1K are cross-sections showing the conventional method for a forming bottle-shaped trench.
Figure 1B:
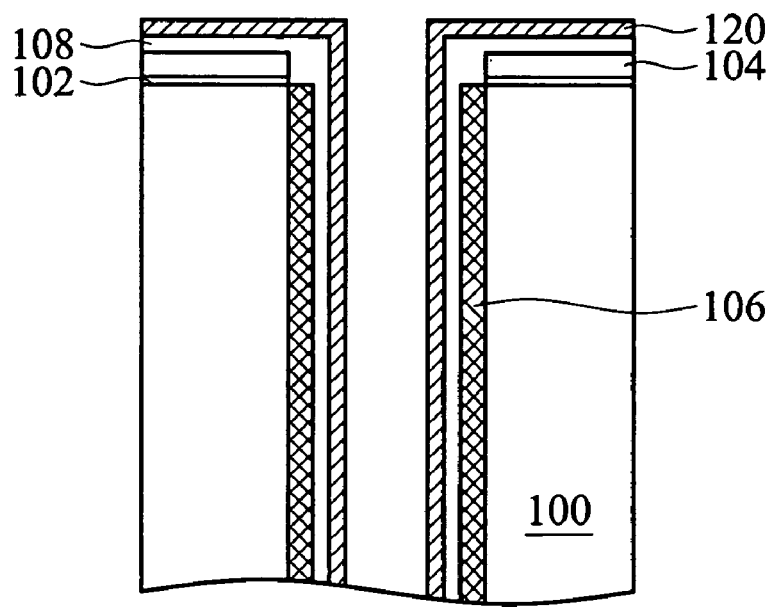
Figure 1C:
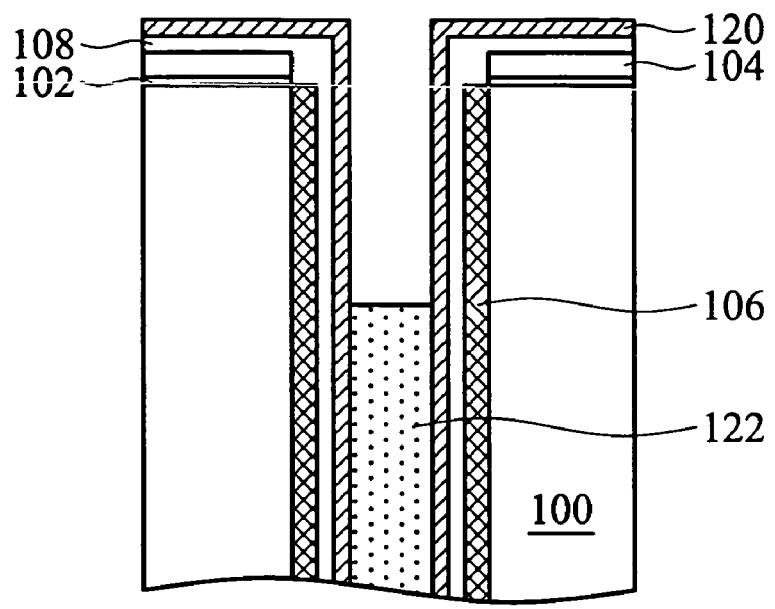
Figure 1D:
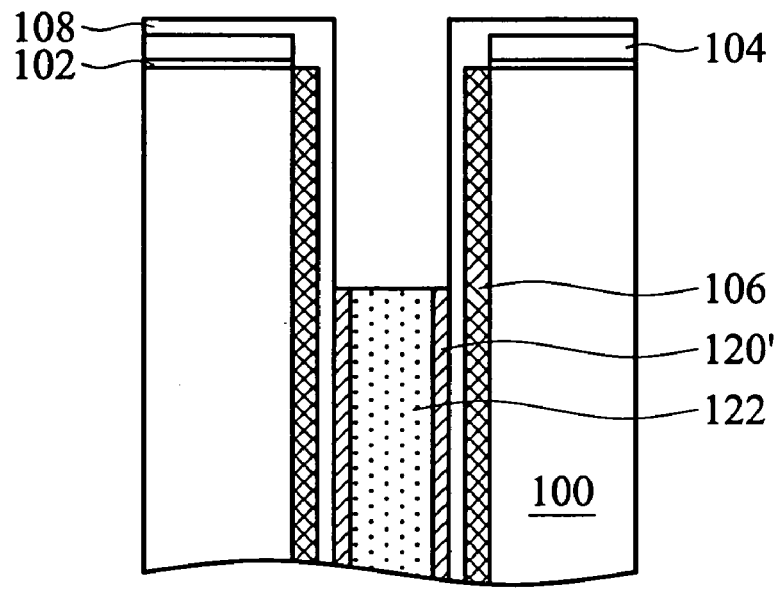
Figure 1E:
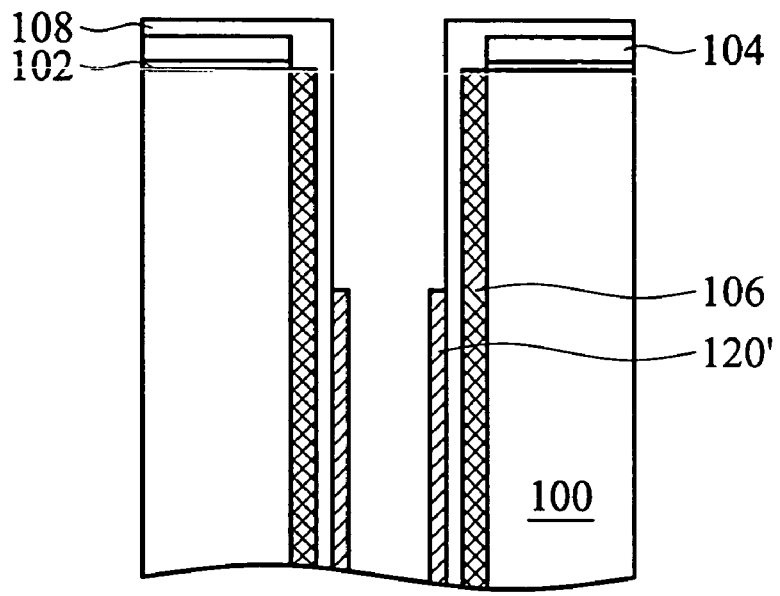
Figure 1F:
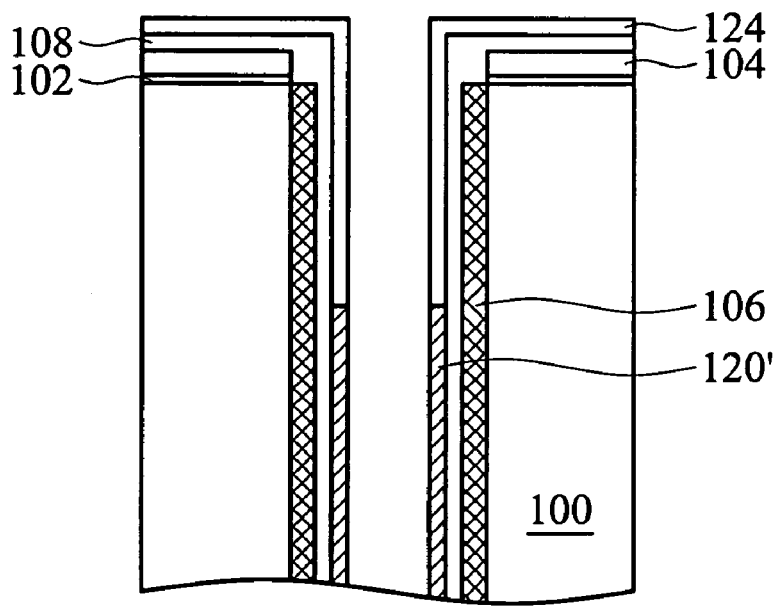
Figure 1G:
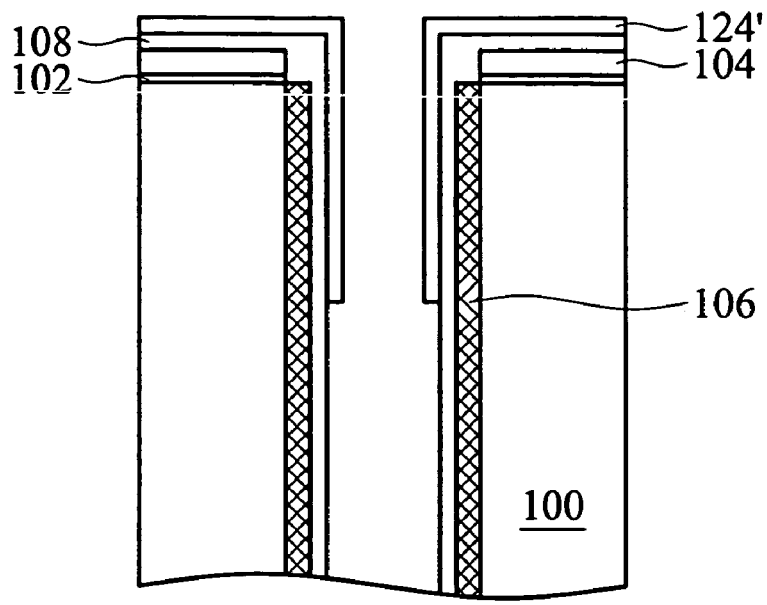
Figure 1H:
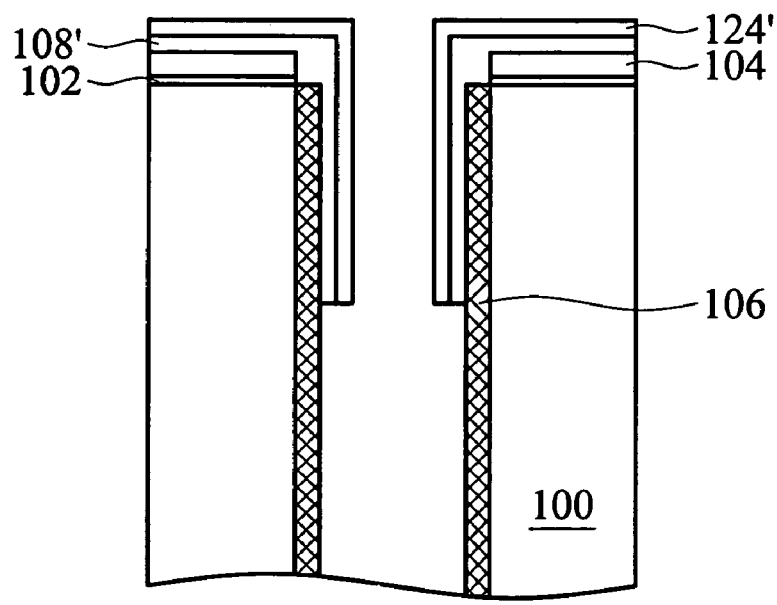
Figure 1I:
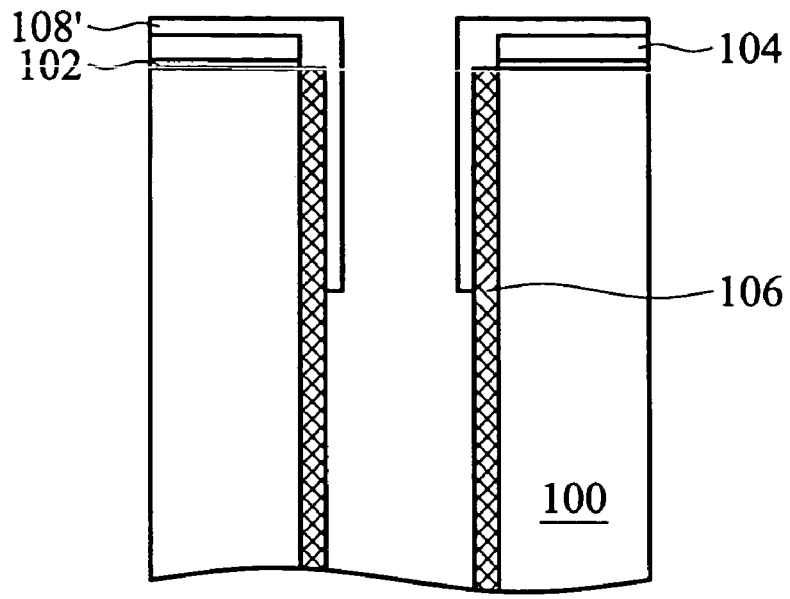
Figure 1J:
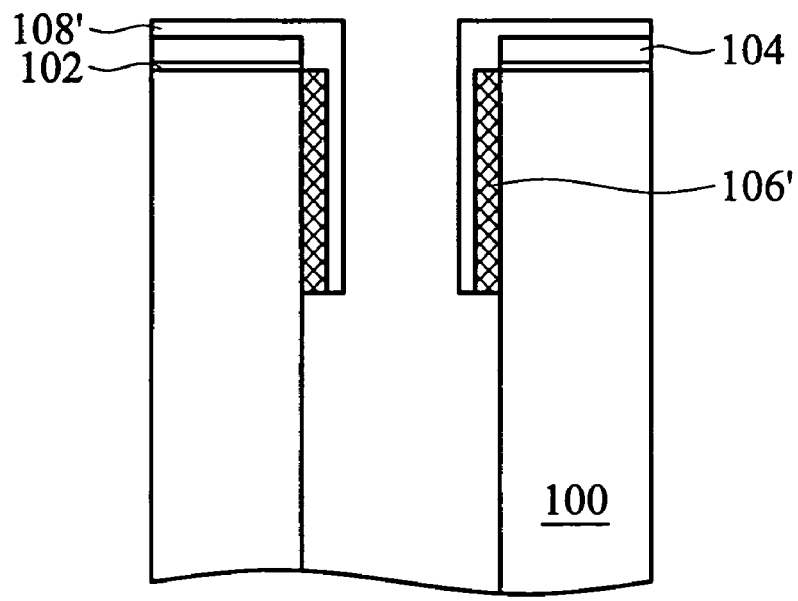
Figure 1K:
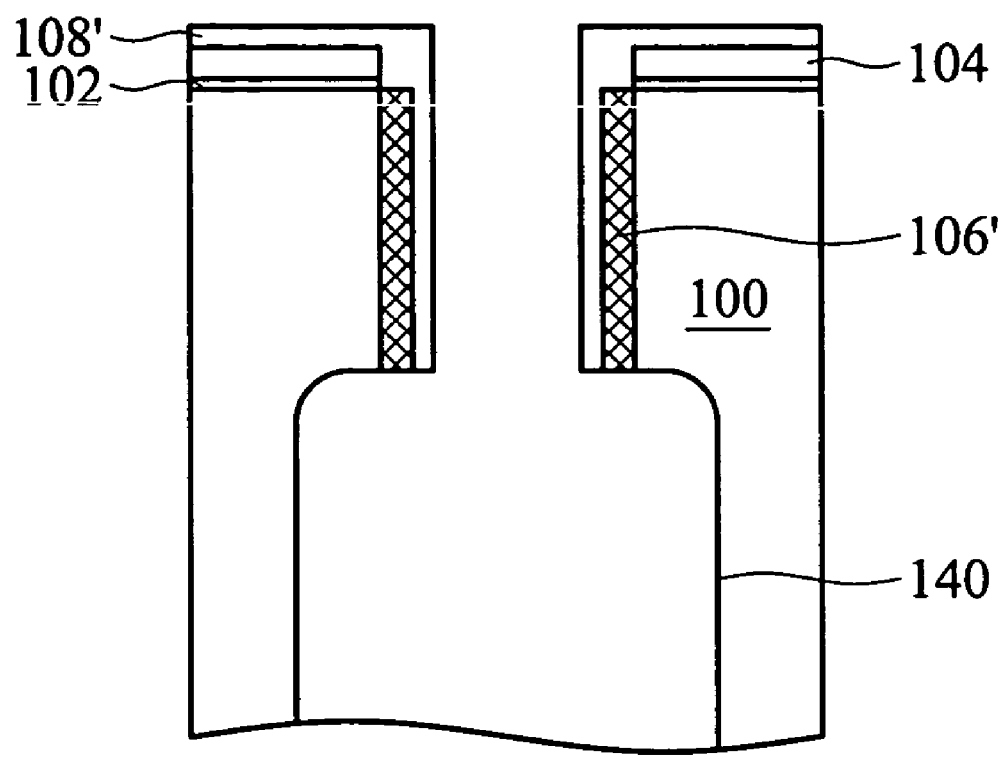

4 RF electrode
6 exhaust
8 magnet ring
10 reactor
12 gas inlet
14 gas injection plate
16 plasma
100, 200, 300 substrate
102, 202, 302 oxide layer
104, 204, 304 nitride layer
106 sidewall oxide layer
108 protective nitride layer
110 polysilicon layer
120 oxidative polysilicon layer
122, 222, 322 mask layer
124, 230, 330 sidewall nitride layer
140, 240, 340 bottle-shaped trench
225, 325 trench

DETAILED DESCRIPTION OF THE INVENTION

FIRST EMBODIMENT

FIGS. 2A to 2E are cross-sections showing a method for forming a bottle-shaped trench according to the first embodiment of the present invention.

Figure 2A:
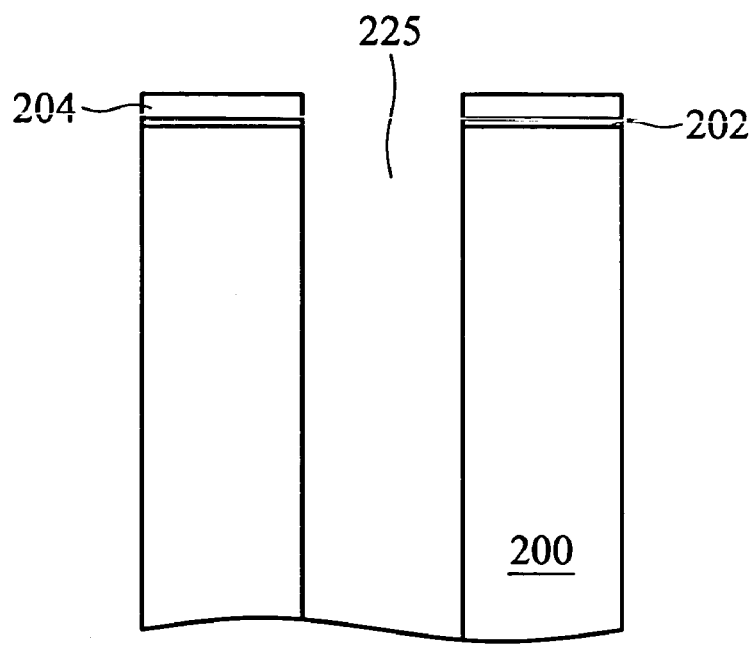
FIGS. 2A to 2E are cross-sections showing a method for forming a bottle-shaped trench according to the first embodiment of the present invention.

In FIG. 2A, a substrate 200 is provided. A pad stack layer is then formed on the substrate 200 by CVD. The pad stack layer is comprised of an oxide layer 202 and a nitride layer 204. Thickness of the oxide layer 202 is 20~100 Å and the nitride layer 204 is 1000~3000 Å. The pad stack layer is used as an etching stop layer for dry etching or chemical mechanical polishing (CMP). An opening is then formed in the pad stack layer by lithography and dry etching. The dry etching method comprises reactive ion etching (RIE) and plasma etching. Next, a trench 225 is formed by plasma etching.

Figure 2B:
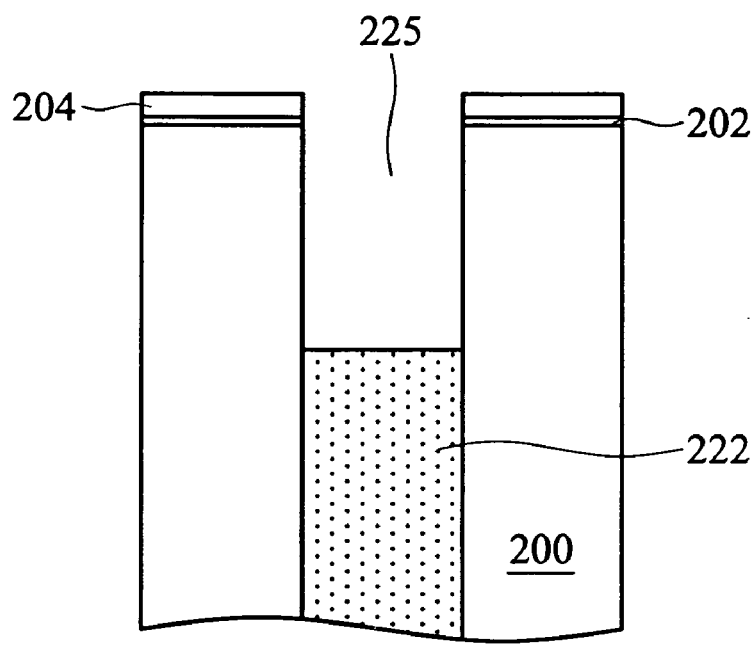

In FIG. 2B, a mask layer 222 is filled to the trench 225. The mask layer 222 is a photoresist layer. Next, the mask layer 222 is etched to a level below the substrate surface 1000~3000 nm by dry etching back.

Figure 2C:
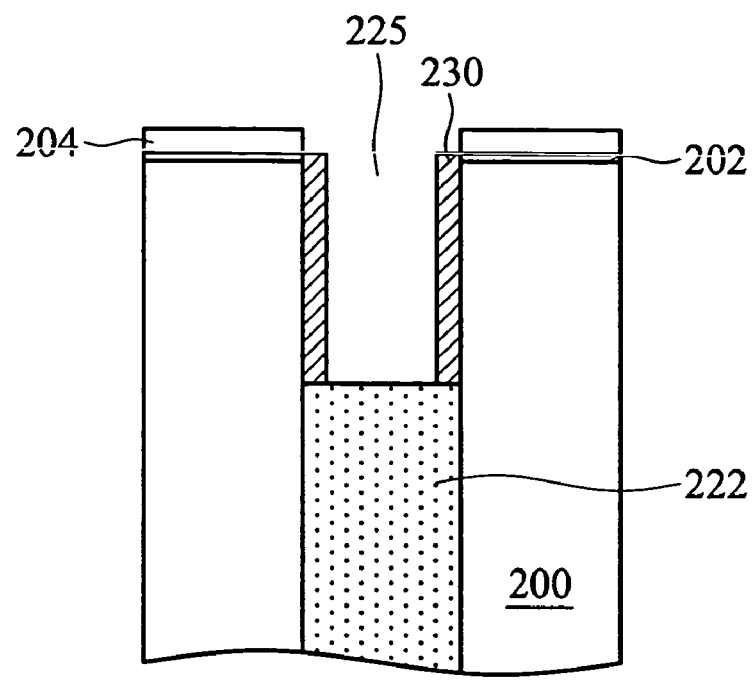

A key point of the present invention is described in the following. In FIG. 2C, a sidewall nitride layer 230 is formed on the exposed trench sidewall by plasma nitridation. The thickness of the sidewall nitride layer 230 is 40~50 Å. Therefore fabrication of the sidewall nitride layer protecting the upper portion of the trench in the present invention is achieved in one step and is simpler than the conventional method.

Figure 2D:
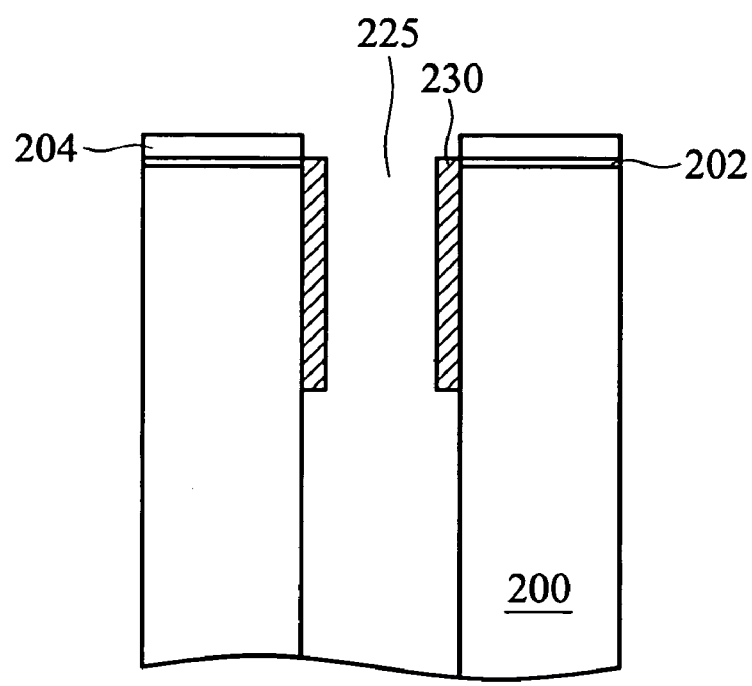

In FIG. 2D, the mask layer 222 is removed by the conventional method.

Figure 2E:
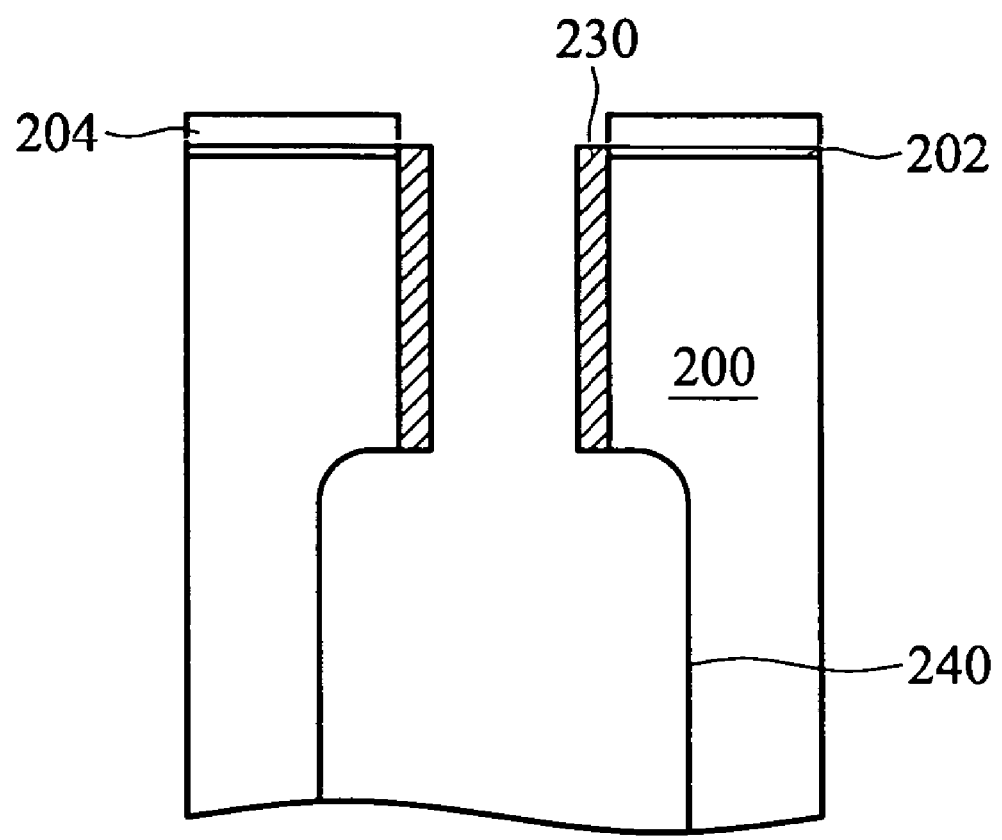

In FIG. 2E, the lower portion of the trench is etched to form a bottle-shaped trench 240 by wet etching. The wet etching solution is ammonia ($NH_4OH+H_2O$). The bottle-shaped trench of the present invention is thus obtained.

Figure 4:
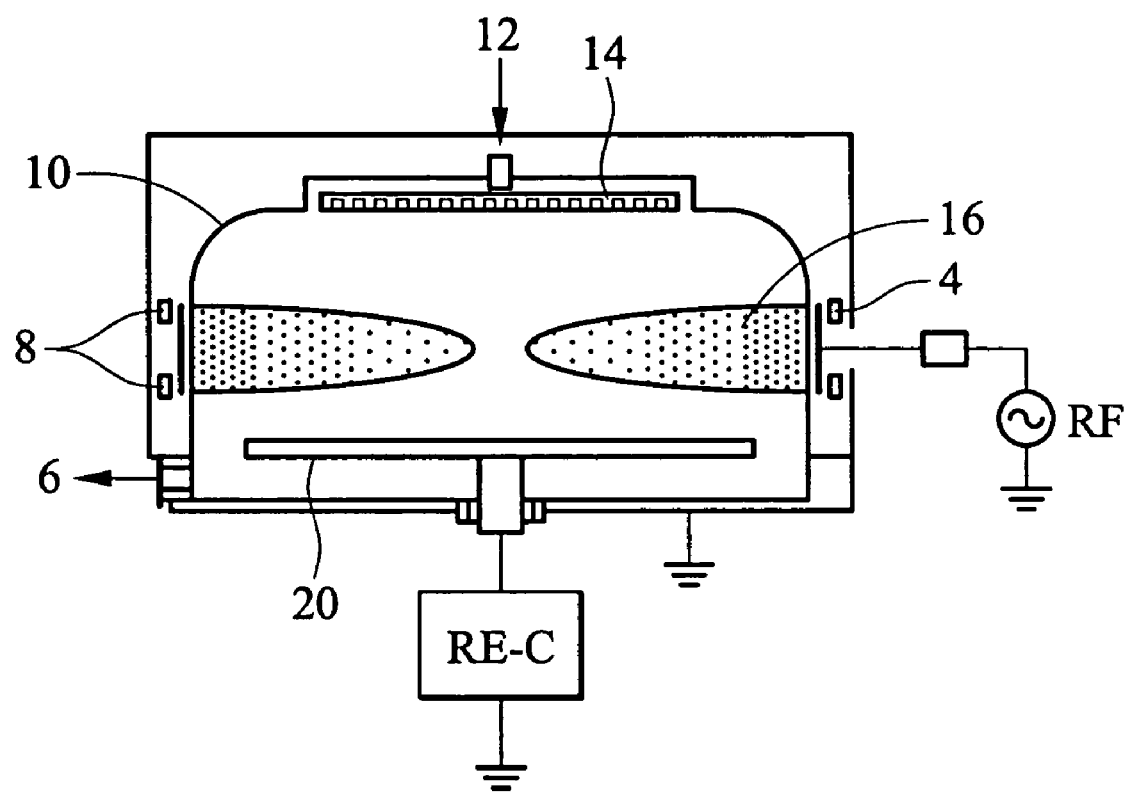
FIG. 4 is a schematic showing the plasma nitridation reactor according to the embodiment of the present invention.

The key point of the present invention is plasma nitridation step. Nitridation is executed by modified magnetron type nitridation (MMT nitridation) and the reactor is shown in FIG. 4. In the reactor 10, a plasma 16 is induced by an RF electrode 4. Preferably, the N source gas is selected from the group consisting of $N_2$, NO, $N_2O$, $NH_3$ and combinations thereof, or the above-mentioned gas mixes with He, Ne, Ar, Kr, or Xe. The N source gas enters the reactor 10 from the gas inlet 12 and gas injection plate 14, passes through the RF electrode 4 the plasma 16 is then induced and deposited on the wafer, then exhausted from the exhaust 6. Preferably, the plasma nitridation temperature is 25~100° C. When the temperature is above 100° C., the photoresist materials of the mask layer may evaporate. Preferably the pressure range is 30~50 Pa and the RF power is 500~1000 W.

SECOND EMBODIMENT

FIGS. 3A to 3F are cross-sections showing a method for forming a bottle-shaped trench according to the second embodiment of the present invention.

Figure 3A:
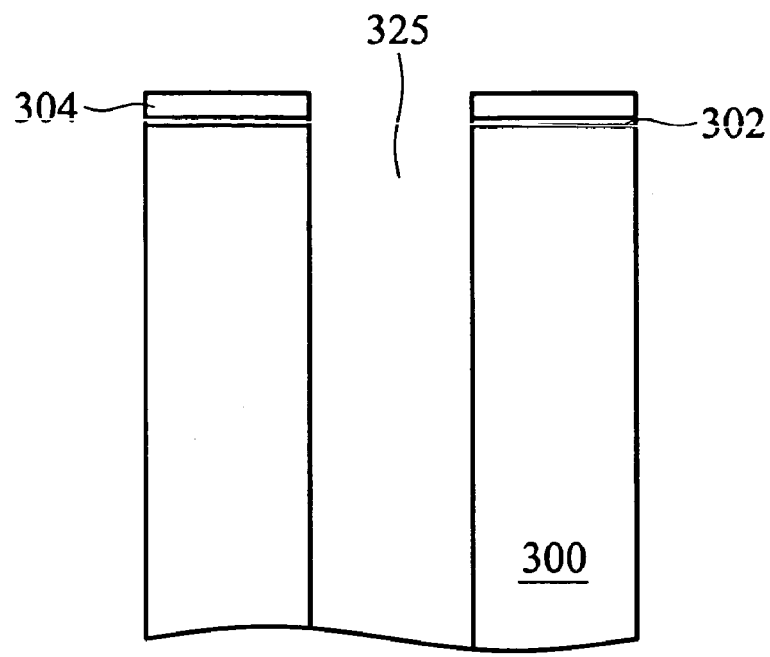
FIGS. 3A to 3F are cross-sections showing a method for forming a bottle-shaped trench according to the second embodiment of the present invention.

In FIG. 3A, a substrate 300 is provided. A pad stack layer is then formed on the substrate 300 by CVD. The pad stack layer is comprised of an oxide layer 302 and a nitride layer 304. Thickness of the oxide layer 302 is 20~100 Å and the nitride layer 304 is 1000~3000 Å. The pad stack layer is used as an etching stop layer for dry etch or chemical mechanism polishing (CMP). An opening is then formed in the pad stack layer by lithography and dry etching. The dry etching method comprises reactive ion etching (RIE) and plasma etching. Next, a trench 325 is formed by plasma etching.

Figure 3B:
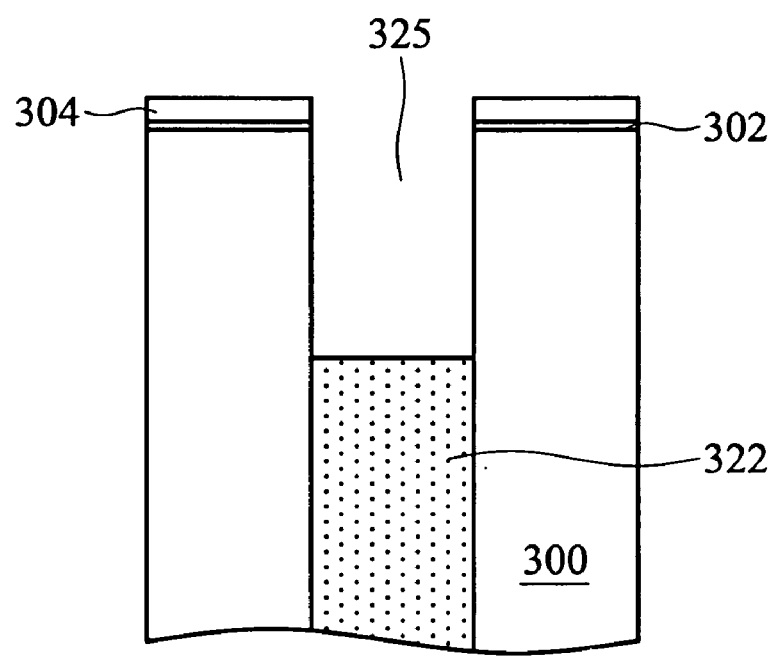

In FIG. 3B, a mask layer 322 is filled into the trench 325. The mask layer 322 is a photoresist layer. Next, the mask layer 322 is etched to a level below the substrate surface 1000~3000 nm by dry etching back.

Figure 3C:
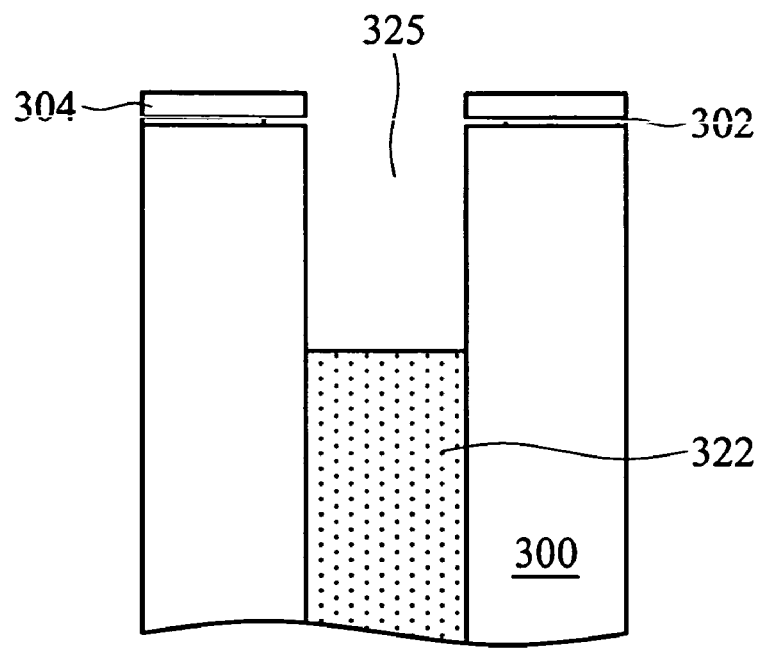

The following step is the key difference between this and the first embodiment. In FIG. 3C, a portion of the pad oxide 302 is etched by diluted HF (DHF) to reveal the substrate corner. The undercut is then filled with nitride layer by subsequent plasma nitridation. The nitride layer with this structure achieves better adhesion during the subsequent etching process.

Figure 3D:
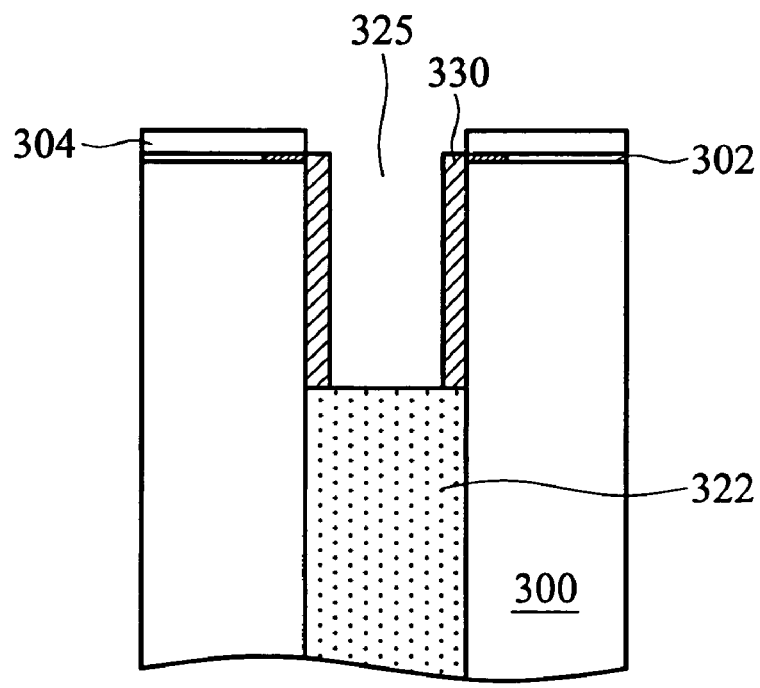

Another key point of the present invention is described in the following. In FIG. 3D, a sidewall nitride layer 330 is formed on the exposed trench sidewall and the pad oxide undercut by plasma nitridation. The plasma nitridation is executed by modified magnetron type nitridation using the same equipment as the first embodiment. Preferably, the nitridation N source gas is selected from the group consisting of $N_2$, NO, $N_2O$, $NH_3$, and combinations thereof, or the above-mentioned gas mixed with He, Ne, Ar, Kr, or Xe. Preferably the plasma nitridation temperature is 25~100° C. When the temperature is above 100° C., the PR materials of the mask layer may evaporate. The pressure range is 30~50 Pa and the RF power is 500~1000 W preferably. The thickness of the sidewall nitride layer 330 is 40~50 Å. Therefore fabrication of the sidewall nitride layer protecting the upper portion of the trench in the present invention is achieved in one step and is simpler than the conventional method.

Figure 3E:
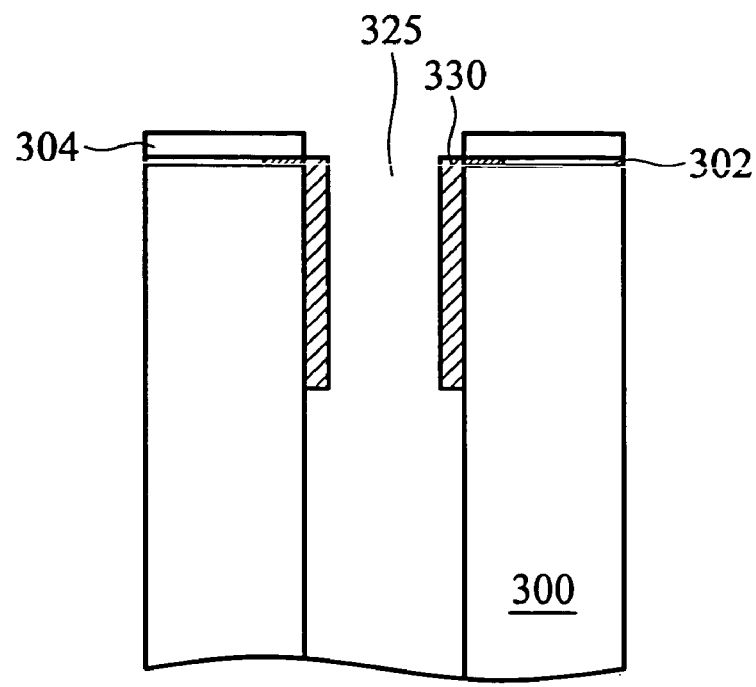

In FIG. 3E, the mask layer 322 is removed by the conventional method.

Figure 3F:
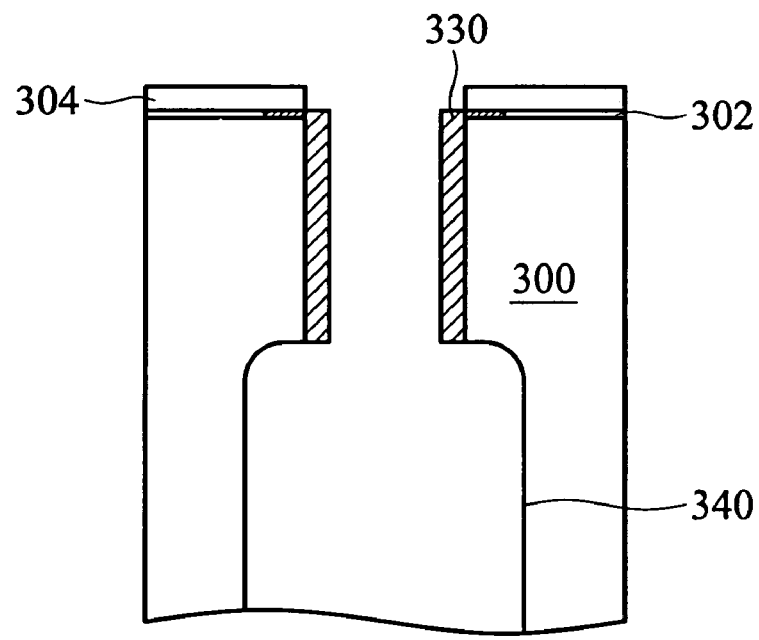

In FIG. 3F, the lower portion of the trench is etched to form a bottle-shaped trench 340 by wet etching. The wet etching solution is ammonia ($NH_4OH+H_2O$). The bottle-shaped trench of the present invention is thus obtained.

While the invention has been described by way of examples and in terms of the two preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a bottle-shaped trench, comprising:
    providing a semiconductor substrate with a trench having a pad stack layer thereon;
    filling a mask layer into the lower portion of the trench;
    plasma nitriding a sidewall of the trench of the substrate using the mask layer as a mask to form a sidewall nitride layer on the trench sidewall;
    removing the mask layer; and
    etching the lower portion of the trench to form a bottle-shaped trench using the sidewall nitride layer as a mask.

2. The method as claimed in claim 1, wherein the pad stack layer comprises an oxide layer and a nitride layer.

3. The method as claimed in claim 1, wherein the mask layer is a photoresist material.

4. The method as claimed in claim 1, wherein the plasma nitridation temperature is 25~100° C.

5. The method as claimed in claim 1, wherein the lower portion of the trench is etched by wet etching.

6. The method as claimed in claim 5, wherein the wet etching solution is ammonia ($NH_4OH+H_2O$).

7. The method as claimed in claim 1, wherein the plasma nitridation pressure is 30~50 Pa.

8. The method as claimed in claim 1, wherein the plasma is RF plasma.

9. The method as claimed in claim 8, wherein the RF power is 500~1000 W.

10. A method for forming a bottle-shaped trench, comprising:
  providing a semiconductor substrate with a trench having a pad stack layer thereon;
  filling a photoresist layer into the lower portion of the trench;
  plasma nitriding a sidewall of the trench of the substrate to form a sidewall nitride layer on the pad stack layer and the upper portion of the trench sidewall not covered by the photoresist layer, wherein the plasma nitriding step has a process temperature of about 25~100° C.;
  after forming the sidewall nitride layer, removing the photoresist layer; and
  etching the lower portion of the trench to form a bottle-shaped trench.

11. The method as claimed in claim 10, wherein the lower portion of the trench etching is wet etching.

12. The method as claimed in claim 11, wherein the wet etching solution is ammonia ($NH_4OH+H_2O$).

13. The method as claimed in claim 10, wherein the plasma nitridation pressure is 30~50 Pa.

14. The method as claimed in claim 10, wherein the plasma is RF plasma.

15. The method as claimed in claim 14, wherein the RF power is 500~1000 W.

16. A method for forming a bottle-shaped trench, comprising:
  providing a semiconductor substrate with a trench having a pad oxide layer and a nitride layer thereon;
  filling a mask layer into the lower portion of the trench;
  etching a portion of the pad oxide layer near the trench to reveal a corner of the substrate;
  using plasma nitridation to form a sidewall nitride layer on the trench sidewall and to fill the pad oxide recess;
  removing the mask layer; and
  etching the lower portion of the trench to form a bottle-shaped trench.

17. The method as claimed in claim 16, wherein the mask layer is photoresist.

18. The method as claimed in claim 16, wherein the plasma nitridation temperature is 25~100° C.

19. The method as claimed in claim 16, wherein the lower portion of the trench is etched by wet etching.

20. The method as claimed in claim 19, wherein the wet etching solution is ammonia ($NH_4OH+H_2O$).

21. The method as claimed in claim 16, wherein the plasma nitridation pressure is 30~50 Pa.

22. The method as claimed in claim 16, wherein the plasma is RF plasma.

23. The method as claimed in claim 22, wherein the RE power is 500~1000 W.

24. A method for forming a bottle-shaped trench, comprising:
  providing a semiconductor substrate with a trench having a pad oxide layer and a nitride layer thereon;
  filling a photoresist layer into the lower portion of the trench;
  etching a portion of the pad oxide layer near the trench to reveal a corner of the substrate;
  using the 25~100° C. plasma nitridation to form a sidewall nitride layer on the trench sidewall and to fill the pad oxide recess;
  removing the photoresist layer; and
  etching the lower portion of the trench to form a bottle-shaped trench.

25. The method as claimed in claim 24, wherein the lower portion of the trench is etched by wet etching.

26. The method as claimed in claim 25, wherein the wet etching solution is ammonia ($NH_4OH+H_2O$).

27. The method as claimed in claim 24, wherein the plasma nitridation pressure is 30~50 Pa.

28. The method as claimed in claim 24, wherein the plasma is RF plasma.

29. The method as claimed in claim 28, wherein the RF power is 500~1000 W.

* * * * *